(12) United States Patent
Mori et al.

(10) Patent No.: US 10,688,565 B2
(45) Date of Patent: Jun. 23, 2020

(54) CUTTING TOOL

(71) Applicant: Kyocera Corporation, Kyoto-shi, Kyoto (JP)

(72) Inventors: Satoshi Mori, Satsumasendai (JP); Yaocan Zhu, Satsumasendai (JP)

(73) Assignee: KYOCERA CORPORATION, Kyoto-shi, Kyoto (JP)

( * ) Notice: Subject to any disclaimer, the term of this patent is extended or adjusted under 35 U.S.C. 154(b) by 168 days.

(21) Appl. No.: 15/576,889

(22) PCT Filed: May 30, 2016

(86) PCT No.: PCT/JP2016/065847
§ 371 (c)(1),
(2) Date: Nov. 27, 2017

(87) PCT Pub. No.: WO2016/190443
PCT Pub. Date: Dec. 1, 2016

(65) Prior Publication Data
US 2018/0147635 A1    May 31, 2018

(30) Foreign Application Priority Data

May 28, 2015  (JP) ................................ 2015-108747

(51) Int. Cl.
*B23B 27/14*   (2006.01)
*C23C 30/00*   (2006.01)
(Continued)

(52) U.S. Cl.
CPC ........ *B23B 27/148* (2013.01); *C23C 14/0605* (2013.01); *C23C 14/325* (2013.01);
(Continued)

(58) Field of Classification Search
USPC ........ 51/307, 309; 427/249.7, 577; 428/212, 428/408, 216, 336
See application file for complete search history.

(56) References Cited

U.S. PATENT DOCUMENTS 4,490,229 A  * 12/1984 Mirtich .................. C23C 16/26
423/446
5,731,045 A  *  3/1998 Dearnaley ............. C23C 30/005
427/249.7
(Continued)

FOREIGN PATENT DOCUMENTS

DE    102011076584    * 11/2012
JP    06-312319       * 11/1994
(Continued)

OTHER PUBLICATIONS

International Search Report based on Application No. PCT/JP2016/065847 (2 Pages) dated Jul. 5, 2016.

*Primary Examiner* — Archene A Turner
(74) *Attorney, Agent, or Firm* — Viering, Jentschura & Partner MBB

(57) ABSTRACT

In an embodiment, a cutting tool is disclosed. The cutting tool includes a base member and a DLC layer. The DLS layer contains diamond-like carbon and is located on a surface of the base member. The DLC layer includes one or more first regions. Each of the one or more first regions contains argon by 0.1-1 mass %.

9 Claims, 4 Drawing Sheets

(51) Int. Cl.
  *C23C 14/06* (2006.01)
  *C23C 28/00* (2006.01)
  *C23C 14/32* (2006.01)
  *C23C 28/04* (2006.01)
  *C23C 16/26* (2006.01)
  *C23C 16/503* (2006.01)

(52) U.S. Cl.
  CPC ............ *C23C 16/26* (2013.01); *C23C 16/503* (2013.01); *C23C 28/046* (2013.01); *C23C 28/42* (2013.01); *C23C 30/005* (2013.01); *B23B 2226/27* (2013.01); *B23B 2228/04* (2013.01)

(56) References Cited

U.S. PATENT DOCUMENTS

| | | | | |
|---|---|---|---|---|
| 5,776,552 | A * | 7/1998 | Tanabe | C23C 16/27 427/577 |
| 7,799,420 | B2 * | 9/2010 | Beck | C23C 14/06 428/408 |
| 2004/0038033 | A1 * | 2/2004 | Massler | C23C 16/029 428/408 |
| 2008/0311310 | A1 * | 12/2008 | Massler | C23C 16/029 204/192.15 |
| 2010/0129615 | A1 * | 5/2010 | Chizik | C23C 14/025 428/189 |
| 2014/0219595 | A1 | 8/2014 | Tsutsui et al. | |

FOREIGN PATENT DOCUMENTS

| | | | |
|---|---|---|---|
| JP | 2003062706 | A | 3/2003 |
| JP | 2003314560 | A | 11/2003 |
| JP | 2004122263 | A | 4/2004 |
| JP | 2004122264 | A | 4/2004 |
| JP | 2005-022073 | * | 1/2005 |
| JP | 2005022073 | A | 1/2005 |
| JP | 2007196360 | A | 8/2007 |
| JP | 2008229755 | A | 10/2008 |
| JP | 2009-220238 | * | 10/2009 |
| JP | 2010253594 | A | 11/2010 |
| JP | 2011-104687 | * | 6/2011 |
| JP | 2011-104722 | * | 6/2011 |
| JP | 2012-125923 | * | 7/2012 |
| JP | 2012125923 | A | 7/2012 |
| WO | 2013042765 | A1 | 3/2013 |

* cited by examiner

CUTTING TOOL

RELATED APPLICATIONS

The present application is a national stage entry according to 35 U.S.C. § 371 of PCT application No. PCT/JP2016/065847 filed on May 30, 2016, which claims priority from Japanese application No. 2015-108747 filed on May 28, 2015, is incorporated herein by reference in its entirety.

TECHNICAL FIELD

The present embodiment relates to a cutting tool having, on a base member, a DLC layer containing diamond-like carbon (DLC).

BACKGROUND ART

The diamond-like carbon layer (DLC layer) is excellent in wear resistance and lubricity, and is therefore used as a coating material for cutting tools, metal molds, and mechanical components. For example, Japanese Unexamined Patent Publication No. 2003-062706 (Patent Document 1) discloses that a DLC layer having a hydrogen content of 5% by atom or less is formed by ark ion plating method using argon gas as a carrier gas. Japanese Unexamined Patent Publication No. 2012-125923 (Patent Document 2) discloses a DLC coating containing argon deposited by a DC plasma CVD method. The DLC layers need improvement of wear resistance and improvement of weld resistance to a workpiece.

SUMMARY

In an embodiment, a cutting tool includes a base member and a DLC layer which is located on a surface of the base member and which contains diamond-like carbon. The DLC layer includes one or more first regions each of which contains argon by 0.1-1 mass %.

EMBODIMENTS

Figure 1:
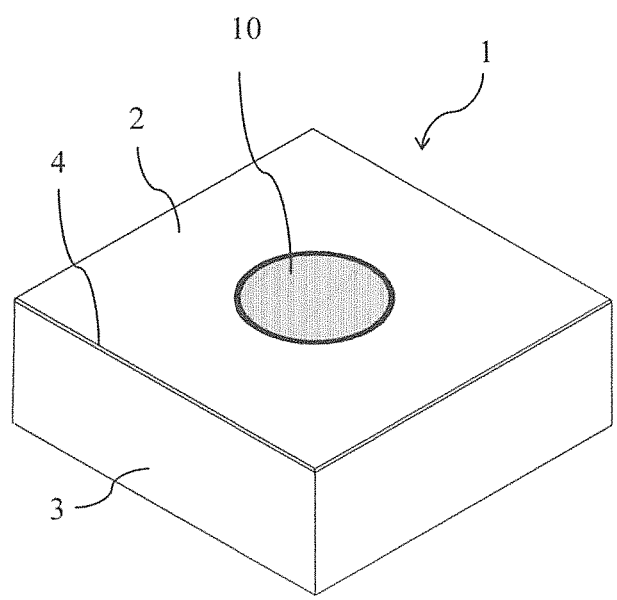
FIG. 1 is a perspective view of a cutting insert that is one embodiment of a cutting tool of the present embodiment.

As shown in FIG. 1, a cutting insert (hereinafter referred to simply as "an insert") 1, which shows one embodiment of a cutting tool, includes a first surface 2, a second surface 3 adjacent to the first surface 2, and a ridge part 4 at an intersecting part of the first surface 2 and the second surface 3. In the present embodiment, at least a part of the first surface 2 serves as a rake surface, and at least a part of the second surface 3 serves as a flank surface. At least a part of the ridge part 4 serves as a cutting edge. The insert 1 also includes a through hole 10 which is opened into the first surface 2 and extends through a surface opposite to the first surface 2.

Figure 2:
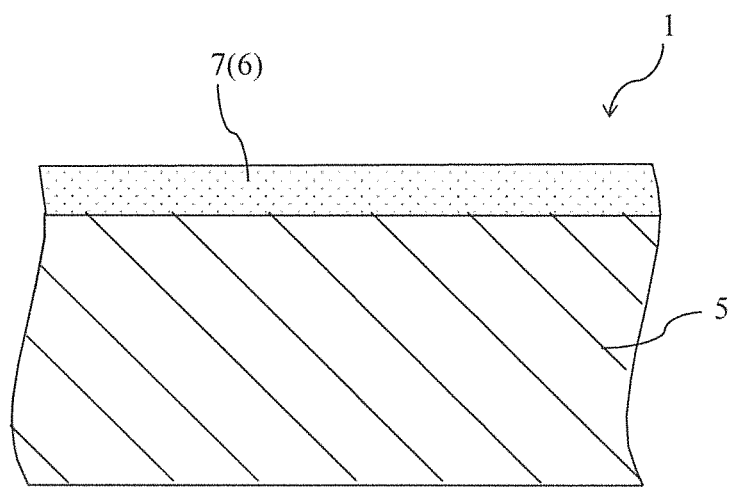
FIG. 2 is an enlarged sectional view of a main part of the cutting insert in FIG. 1.

As shown in the sectional view of FIG. 2, the insert 1 includes a base member 5 and a DLC layer 6 located on the base member 5. The term "located on the base member 5" denotes that the DLC layer 6 is located on a surface of the base member 5 before coating. Although the DLC layer 6 needs to be located at least a part on the base member 5, the DLC layer 6 is located so as to cover approximately the entirety of the base member 5 in the present embodiment. In other words, the base member 5 is covered with the DLC layer 6.

The DLC layer 6 contains diamond-like carbon as a main ingredient. The term "as a main ingredient" denotes that the DLC layer 6 contains the diamond-like carbon having a larger mass than other ingredients.

The DLC layer 6 in the present embodiment includes a first region 7 containing argon in a proportion of 0.1-1% by mass. FIG. 2 shows an embodiment that the DLC layer 6 is composed of the first region 7. The first region 7 is excellent in wear resistance and can suppress a welding of a workpiece because of containing the argon in the proportion of 0.1-1% by mass. Accordingly, the DLC 6 including the first region 7 is also excellent in wear resistance and can suppress the welding of the workpiece. Hence, the effect of coating owing to the DLC layer 6 is retainable over a long term in the insert 1 of the present embodiment. A preferable range of the argon content in the first region 7 is 0.2-0.5% by mass.

The phrase "when the argon content in the first region 7 is 0.1% by mass or more" is due to that argon is being irradiated to the base member 5 during deposition. An oxide layer is removal and the surface of the base member 5 is cleanable by the irradiation of argon toward the base member 5. Because the surface of the base member 5 being so cleaned is subjected to deposition, adhesion between the base member 5 and the first region 7 is enhanced, thus being excellent in wear resistance. Therefore, when the argon content in the first region 7 is 0.1% by mass or more, the first region 7 has high adhesion to the base member 5, leading to excellent wear resistance.

When the argon content in the first region 7 is 1% by mass or less, it is possible to reduce the welding of the workpiece to the insert 1 during a cutting process of the workpiece. Alternatively, when the deposition is carried out by arc ion plating method by using argon gas as a carrier gas, instead of the irradiation of argon, the argon content in a film is less than 0.1% by mass. Still alternatively, when the deposition is carried out by DC plasma CVD method, the argon content in a film exceeds 1% by mass.

In the present embodiment, the argon content in the first region 7 is measurable by WDS (Wavelength Dispersive Spectroscopy EPMA) analysis method. The measurement is made under conditions that an accelerating voltage is 15 kV and a probe current is $1\times10^{-7}$ A. Although it is preferable to make a measurement in a range, as an analysis region, which has a diameter of 100 μm or more if possible, the measurement may be made in a range having a diameter of less than 100 μm if it is difficult to ensure the range having the diameter of 100 μm or more.

As a method of measuring each of the argon contents at different thickness positions in the DLC layer 6, there are, for example, a method of making a measurement on a polished surface of the DLC layer 6 while polishing the surface of the DLC layer 6 by a predetermined thickness, and a method of making measurements at various thickness positions on a polished surface of the DLC layer 6 by obliquely polishing the DLC layer 6 so as to vary the thickness thereof.

In the present embodiment, a determination is made that the first region 7 exists when the argon content measured at one point in the DLC layer 6 is 0.1-1% by mass. Alternatively, a determination is made that a range in which the argon content is 0.1-1% by mass is the first region 7, by measuring each of the argon contents at the different thickness positions.

Figure 3:
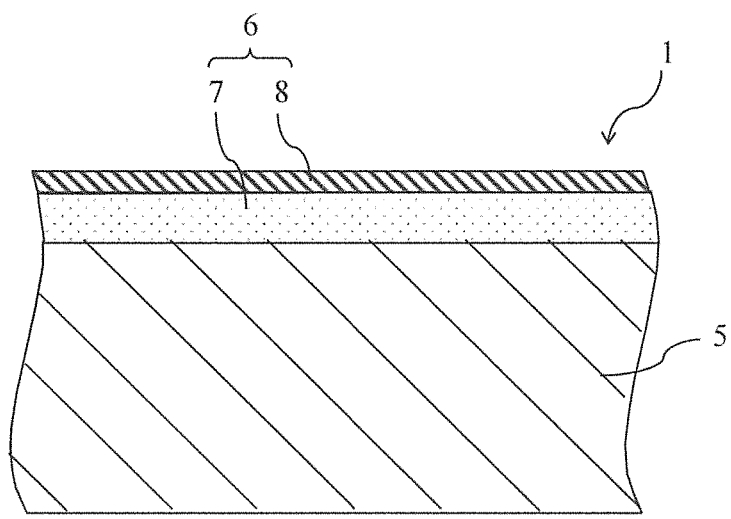
FIG. 3 is a sectional view that shows another embodiment of a region corresponding to FIG. 2.

Although the DLC layer 6 may be composed of a single region made up only of the first region 7, the DLC layer 6 may be composed of a plurality of regions as shown in FIG. 3. The DLC layer 6 in the embodiment shown in FIG. 3 includes a first region 7 being in contact with the base member 5, and a second region 8 located on the first region 7. The second region 8 has a smaller argon content ratio than the first region 7.

When a boundary between the first region 7 and the second region 8 is clear in a sectional view of the DLC layer 6, the first region 7 may be rewarded as a first layer, and the second region 8 may be rewarded as a second layer. The boundary between the first region 7 and the second region 8 need not necessarily be clear. When the boundary is unclear, the argon content needs to be measured at a plurality of positions in the DLC layer 6, and the boundary between the first region 7 and the second region 8 needs to be evaluated on the basis of these measurement results.

In the present embodiment, the second region 8 has a smaller argon content ratio than the first region 7, and is located on the first region 7. When this configuration is satisfied, it is possible to reduce the welding of the workpiece to the DLC layer 6. The first region 7 has a higher argon content ratio than the second region 8. Therefore, the DLC layer 6 of the insert 1 in the embodiment shown in FIG. 3 has high adhesion to the base member 5.

The weld resistance is kept extremely high when the argon content ratio in the second region 8 is less than 0.1% by mass.

The DLC layer 6 can be enhanced in terms of the weld resistance and the adhesion to the base member 5 when a thickness t1 of the first region 7 is 0.1-1 μm, and a thickness t2 of the second region 8 is 0.1-0.6 μm in the present embodiment. A ratio (t2/t1) of the thickness t1 of the first region 7 and the thickness t2 of the second region 8 is 0.2-3.0.

The thickness t1 of the first region 7 and the thickness t2 of the second region 8 are defined as follows. By measuring the argon content at the different thickness positions in the DLC layer 6, a range in which the argon content is 0.1-1 μm is taken as the first region 7, and other regions, namely, an upper layer of the first region 7 in the present embodiment is taken as the second region.

As used herein, the term "the thickness of the first region 7 and the thickness of the second region 8" denotes a length in a direction orthogonal to an interface of the base member 5 and the DLC layer 6 (hereinafter also referred to as "a surface of the base member 5"). A thickness direction of the first region 7 and the second region 8 may change depending on a position of the surface of the base member 5.

In the present embodiment, a thickness of a part of the DLC layer 6 which is located on the first surface 2 is made larger than a thickness of a part of the DLC layer 6 which is located on the second surface 3. When this configuration is satisfied, at least a part of the first surface 2 serves as a rake surface, thereby enhancing wear resistance to chips flowing along the rake surface.

Moreover, a thickness of a part of the DLC layer 6 which is located at the ridge part is made larger than a thickness of a part of the DLC layer 6 which is located on each of the first surface 2 and the second surface 3. When this configuration is satisfied, at least a part of the ridge part 4 serves as a cutting edge, and hence the thickness of the DLC layer 6 located along the cutting edge is large, thereby enhancing wear resistance during the cutting process.

The thickness of the part of the DLC layer 6 which is located at the ridge part 4 needs to be evaluated by a thickness of the DLC layer 6 in a direction along a bisector of two surfaces (the first surface 2 and the second surface 3) constituting the ridge part 4 in a cross section orthogonal to these two surfaces.

In the present embodiment, the base member 5 is composed of a hard alloy containing a hard phase and a binding phase. As the hard alloy, there are, for example, cemented carbide whose binding phase is composed of an iron group metal and whose hard phase is composed of tungsten carbide, and cermet whose hard phase is composed of titanium carbon nitride. The iron group metal as the binding phase is susceptible to oxidation, but has high adhesion to the DLC layer 6 in the present embodiment. A content of the binding phase is 5-15% by mass, particularly 6-10% by mass. Other examples of the base member include ceramics.

The coated tool is applicable to not only the cutting insert 1 of the present embodiment but also general cutting tools. Among others, a drill, an end mill, a reamer, or a router is suitable, each of which has the following configuration. That is, a tool body has a bar shape and has a bottom edge at a front end thereof. The tool body has an outer peripheral edge on a front end side of an outer periphery thereof, and has a chip discharge flute that extends rearward from the front end and is adjacent to the bottom cutting edge and the outer peripheral edge. Besides these, the coated tool is also applicable to a sliding member and a wear resistant member.

Another embodiment of the insert 1 according to one embodiment is described below with reference to FIG. 4. The following description focuses on a difference from the insert 1 shown in FIGS. 1 to 3, and descriptions of configurations similar to those in the insert 1 shown in FIGS. 1 to 3 are omitted here.

Figure 4:
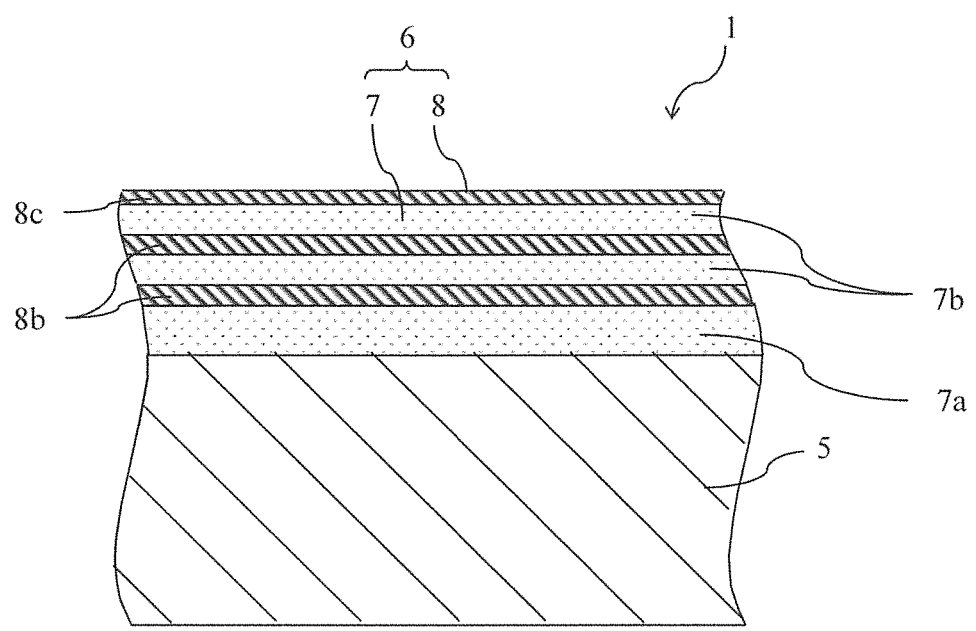
FIG. 4 is a sectional view that shows still another embodiment of the region corresponding to FIG. 2.

The insert 1 of the embodiment shown in FIG. 4 includes a base member 5 and a DLC layer 6 as in the insert 1 shown in FIGS. 1 to 3, but has a different configuration of the DLC layer 6. Specifically, the insert 1 of the embodiment shown in FIG. 4 includes a plurality of first regions 7 and a plurality of second regions 8. These first regions 7 and these second regions 8 are alternately overlapped with each other. When each of the first regions 7 is taken as a first layer and each of the second regions 8 is taken as a second layer, the DLC layer 6 can be taken as a laminate in which the first layer and the second layer are alternately laminated. The first region 7 is referred to as the first layer 7, and the second region 8 is referred to as the second layer 8 in the following description of FIG. 4.

Durability of the DLC layer 6 can be enhanced when the DLC layer 6 is provided with the first layers 7 and the second layers 8 which are overlapped with each other as described above. This is because residual stress exerted on the DLC layer 6 is reduced as a result of increase in boundary between the first layers 7 and the second layers 8. The DLC layer 6 having the plurality of first layers 7 and second layers 8 also produces an advantage of increasing the thickness of the DLC layer 6.

The first layers 7 may have an identical thickness. However, when an innermost layer 7a of these first layers 7 which is closest to the base member 5 has a largest thickness, the adhesion (connection properties) between the base member 5 and the DLC layer 6 can be enhanced. FIG. 4 shows the embodiment that the innermost layer 7a is thicker than an intermediate layer 7b interposed between the second layers 8.

The second layers 8 may have an identical thickness. However, when an intermediate layer 8b interposed between the first regions 7 is larger than a thickness of an outermost layer 8c farthest from the base member 5 among the second regions 8, residual stress that may occur between the first region 7 and the second region 8 can be well mitigated in the second region 8.

(Manufacturing Method)

A method of manufacturing a coated tool including the DLC layer 6 as described above is described below.

A base member 5 is firstly prepared. For example, when the coated tool is the insert 1, a sintered body is prepared by sintering, and is then subjected to a polishing process if desired, thereby preparing the base member 1 having a shape corresponding to the insert 1. When the coated tool is a drill, a surface of a columnar-shaped hard alloy is subjected to a centerless process, followed by a sharpening process, thereby preparing a drill shaped base member. A cutting edge side of the base member is subjected to a polishing process if desired.

Thereafter, the DLC layer 6 is deposited. A specific method of depositing the DLC layer 6 is described. Firstly, a target composed of graphite is put in a chamber of a cathode arc ion plating apparatus, and a sample is set into the apparatus. Subsequently, an ion bombardment treatment is carried out by heating the interior of the chamber to 100-200° C., and loading argon gas into the chamber. Then, after the argon gas is removed, a bias voltage of 30-100 V is applied while passing argon gas so as to reach 0.2-0.5 Pa. In a state in which plasma is generated, argon ion is implanted into the sample by irradiating argon to the sample by using an argon ion gun, and a carbon source is evaporated from the target at the same time, so that the first region 7 composed mainly of DLC is deposited on the surface of the base member 5.

In order to deposit the second region 8, deposition needs to be carried out using no ion gun. That is, a bias voltage of 30-100 V is applied while passing argon gas so as to reach 0.2-0.5 Pa. In a state in which plasma is generated, a carbon source is evaporated from the target, so that the second region 8 is deposited on the surface of the base member 5 having the first region 7 deposited thereon.

EXAMPLES

An amount of 7.0% by mass of metal cobalt (Co) powder, an amount of 0.8% by mass of chrome carbide ($Cr_3C_2$) powder, and an amount of the rest that was tungsten carbide (WC) powder having a mean particle diameter of 0.5 μm were added and mixed together. This was then molded into a columnar shape, followed by sintering. This was then subjected to a centerless process and a sharpening process into a base member with a drill shape (a drill diameter φ of 0.105×1.8 mm).

A graphite target and the base member were set into the arc ion plating apparatus. An argon bombardment treat using argon was carried out at 100° C. to clean the surfaces of the target and the base member. As to some of samples presented in Table 1, a diamond-like carbon layer was deposited on the surface of the base member under deposition conditions presented in Table 1, while implanting argon into the samples by using the argon ion gun.

An argon content of the deposited DLC layer was measured by WDS (Wavelength Dispersive Spectroscopy EPMA) analysis method. A thickness of the DLC layer was measured with SEM observation of the DLC layer deposited on the surface of the drill.

Moreover, cutting performance was evaluated by conducting a cutting test using the obtained drills under the following conditions. The results were presented in Table 1.
Cutting method: shouldering by a machining center Workpiece: A5052
Cutting speed (feed): 800 m/min
Feed rate: 0.1 mm/cutting edge
Depth of cut: 3 mm in cutting depth, 5 mm in cutting width
Cutting state: air blow
Evaluation method: Checking a cutting length and a state of the drill when the drill became inoperable (indicated as a cutting state in the table)

TABLE 1

| Sample No. | First layer Ion gun | First layer Bias voltage (V) | Second layer Ion gun | Second layer Bias voltage (V) | Thickness (μm) First layer t1 | Thickness (μm) Second layer t2 | Thickness (μm) Total amount of the thickness | t2/t1 | Argon content (% by mass) First layer | Argon content (% by mass) Second layer | Cutting performance Cutting length (m) | Cutting performance Cutting state |
|---|---|---|---|---|---|---|---|---|---|---|---|---|
| 1 | Yes | 75 | No | 75 | 0.5 | 0.2 | 0.5 | 0.4 | 0.2 | <0.1 | 55 | Small welding |
| 2 | Yes | 100 | No | 100 | 0.2 | 0.6 | 0.8 | 3.0 | 0.3 | <0.1 | 60 | Small welding |
| 3 | Yes | 75 | No | 100 | 0.8 | 0.2 | 1.2 | 0.3 | 0.2 | <0.1 | 65 | Small welding |
| 4 | Yes | 100 | No | 100 | 0.7 | 1.0 | 0.7 | 1.4 | 0.5 | 0.2 | 51 | Medium welding |
| 5 | Yes | 100 | No | 50 | 0.2 | 0.4 | 1.2 | 2.0 | 0.5 | <0.1 | 53 | Small welding |
| 6 | Yes | 75 | | — | 0.6 | — | 0.6 | — | 0.3 | — | 50 | Medium welding |
| 7 | Yes | 100 | | — | 0.5 | — | 0.5 | — | 1.0 | — | 46 | Medium welding |
| 8 | Yes | 50 | Yes | 50 | 0.3 | 0.5 | 0.8 | 1.7 | 0.1 | 0.2 | 45 | Medium welding |
| 9 | Yes | 200 | | — | 1.0 | — | 1.1 | — | 1.2 | — | 40 | Large welding Separation |
| 10 | No | 100 | | — | 0.8 | — | 0.8 | — | <0.1 | — | 30 | Large wearing Separation |

Table 1 shows the following. That is, in Sample No. 10 in which when depositing the DLC layer, the deposition was not carried out using the ion gun, the argon content was less than 0.1% by mass, the wear resitance was lowered, the adhesion of the DLC layer was poor, and separation of the DLC layer was obserbed. In Sample No. 9 in which the bias voltage when depositing the DLC layer exceeded 100 V, the argon content exceeded 1% by mass, the welding of the workpiece was severe, the adhesion of the coating layer was poor, and separation was observed.

In contrast, in Samples Nos. 1 to 8, each having the first region 7 whose argon content was 0.1-1% by mass, welding to the workpiece was not severe, the wear resistance was high, and the cutting length was increased. Particularly, in Samples Nos. 1 to 3, and 5, each having the first region 7 whose argon content was 0.1-1% by mass, and the second region 8 whose argon content ratio of less than 0.1% by mass, the weld resistance was high, and the cutting length was increased. In Samples Nos. 1 to 3, and 5, in which the thickness of the first region having an argon content of 0.1-1% by mass was 0.1-1.0 μm, and the thickness of the second region having an argon content ratio of less than 0.1% by mass was 0.1-0.6 μm, the cutting length was further increased.

DESCRIPTION OF THE REFERENCE NUMERAL 1 cutting insert (insert)
2 first surface (rake surface)
3 second surface (flank surface)
4 ridge part (cutting edge)
5 base member
6 DLC layer
7 first region (first layer)
8 second region (second layer)
10 through hole

What is claimed is:

1. A cutting tool, comprising:
   a base member; and
   a DLC layer on a surface of the base member, containing diamond-like carbon,
   wherein the DLC layer comprises one or more first regions each containing argon by 0.1-1 mass %.

2. The cutting tool according to claim 1, wherein the DLC layer further comprises one or more second regions each of which contains less argon content than each of the one or more first regions, and which is located on the one or more first regions.

3. The cutting tool according to claim 2, wherein the one or more second regions each has an argon content less than 0.1 mass %.

4. The cutting tool according to claim 2, wherein the one or more first regions and the one or more second regions each includes a layer in shape, and are alternately located in a thickness direction of the DLC layer.

5. The cutting tool according to claim 4, wherein a thickness of an innermost layer closest to the base material among the one or more first regions each having a layer in shape is largest thereamong.

6. The cutting tool according to claim 4, wherein a thickness of an intermediate layer between two of the two or more first regions is larger than a thickness of an outermost layer farthest from the base member among the one or more second regions each having a layer in shape.

7. The cutting tool according to claim 1, further comprising:
   a first surface;
   a second surface adjacent to the first surface; and
   a ridge part at a portion that the first surface intersects with the second surface,
   wherein a thickness of a part of the DLC layer which is located on the first surface is larger than a thickness of a part of the DLC layer which is located on the second surface.

8. The cutting tool according to claim 7, wherein a thickness of a part of the DLC layer which is located at the ridge part is larger than a thickness of the part of the DLC layer which is located on the first surface and than a thickness of the part of the DLC layer which is located on the second surface.

9. The cutting tool according to claim 2, wherein a thickness of each of the one or more first regions is 0.1-1 μm, and a thickness of each of the one or more second regions is 0.1-0.6 μm.

* * * * *